United States Patent [19]

Jackson

[11] Patent Number: 4,815,203

[45] Date of Patent: Mar. 28, 1989

[54] ELECTRONIC COMPONENT INSERTION MACHINE

[75] Inventor: Rodney P. Jackson, Auburn, Mass.

[73] Assignee: Emhart Industries, Inc., Farmington, Conn.

[21] Appl. No.: 182,861

[22] Filed: May 2, 1988

[51] Int. Cl.[4] ............................................ B23P 19/04
[52] U.S. Cl. ........................................ 29/741; 29/739; 29/740; 74/829
[58] Field of Search .................... 29/741, 739; 74/829; 198/468.2

[56] References Cited

U.S. PATENT DOCUMENTS

| | | |
|---|---|---|
| 4,161,064 | 7/1979 | Woodman, Jr. et al. ............ 29/741 |
| 4,420,878 | 12/1983 | Tripp ..................................... 29/741 |
| 4,635,341 | 1/1987 | Staudinger ........................... 29/741 |
| 4,718,162 | 1/1988 | Schuppert et al. .................. 29/741 |
| 4,736,517 | 4/1988 | Wright et al. ........................ 29/741 |

Primary Examiner—P. W. Echols
Assistant Examiner—K. Jordan
Attorney, Agent, or Firm—Spencer T. Smith

[57] ABSTRACT

A machine for inserting DIP components either into a circuit board or into sockets on the circuit board having two alternate heights. The insetion machine can be advanced a given distance by a fixed stroke cylinder, and the upper location of this stroke can be matched to the upper surface of the circuit board or to the top surface of either of the sockets by a cam which can be displaced horizontally to three distant locations.

2 Claims, 2 Drawing Sheets

ELECTRONIC COMPONENT INSERTION MACHINE

A dual in-line package (DIP) component insertion machine inserts DIP components either into a circuit board or into sockets which have previously been inserted into a circuit board. In state-of-the-art machines such as shown in U.S. Pat. No. 3,550,238, each component is presented to a gripper mechanism which has a pair of opposed jaws which grip the opposed rows of leads. The gripper mechanism lowers the gripped component to partially insert the leads through receiving holes in the circuit board or socket whereupon the jaws are retracted to release the component. A pusher located above the component is lowered to engage and fully seat the component.

Since a DIP component may be inserted into the circuit board or into sockets already placed on the circuit board, and since the sockets may have different sizes which locate the top surface thereof at either of two heights relative to the surface of the circuit board, the gripper mechanism should be adjustable to any of three heights; normal for inserting DIP's into a circuit board; 0.170 above normal for inserting DIP's into a 0.170 socket; and 0.200 above normal for inserting a DIP into a 0.200 socket or for "brickwalling" sockets. U.S. Pat. Nos. 4,161,064 and 4,736,517 disclose conventional structure for adjusting the height of the gripping mechanism.

It is an object of the present invention to provide an improved mechanism for adjusting the height of the component.

Other objects and advantages of the present invention will become apparent from the following portion of the specification and from the accompanying drawings, which illustrate, in accordance with the mandate of the patent statutes, a presently preferred embodiment of the invention.

Referring to the drawings.

Figure 1:
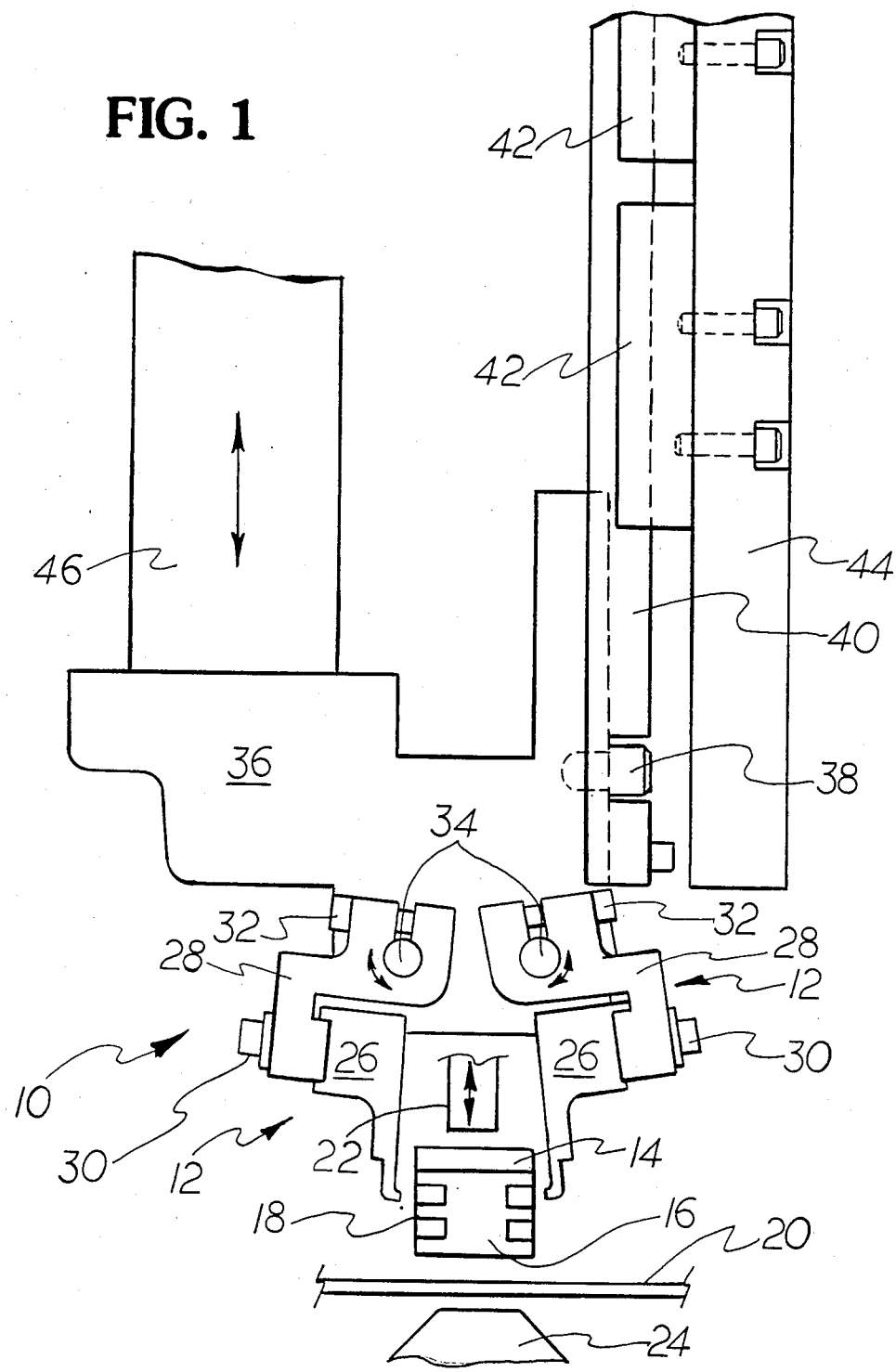
FIG. 1 is a side elevational view of a portion of the insertion head of a DIP component insertion machine.

The DIP component insertion machine has an insertion head 10 which has a pair of gripping mechanisms 12 which are rotatable from the illustrated retracted position to advanced positions to grip a DIP component 14 or a socket supported on a support mandrel 16. When the DIP component has been gripped, the mandrel is retracted and the gripped component is lowered to partially insert the leads 18 of the component 14 into a supported circuit board 20. A pusher 22 is lowered to fully seat the component and a cut and clinch mechanism 24 secures the component to the circuit board.

The gripping mechanisms 12, which include a finger element or jaw 26 secured to a finger holder 28 by suitable screws 30, are clamped by screws 32 to shafts 34 rotatably supported by a finger assembly housing 36. The housing 36 is secured by screws 38 to a vertical slide 40 which is guided by linear motion bearings 42 secured to the machine frame 44. The slide, and hence, the gripping mechanisms can be lowered and elevated by a cylinder 46 which is secured at one end to the housing 36. Additional details of the gripping mechanisms are disclosed in U.S. Ser. No. 182,862, filed of even date herewith and incorporated herein by reference.

The insertion head may insert a DIP component into the circuit board 20 or it may insert the component into 0.170 or 0.200 (inch) sockets which have been previously inserted into the circuit board. Since the cylinder has a fixed stroke, means are provided to raise the head assembly by either 0.170 or 0.200 inches so that the position of a gripped component can be changed prior to insertion to maintain a constant spacing between the DIP component and the surface into which it is to be inserted.

Figure 2:
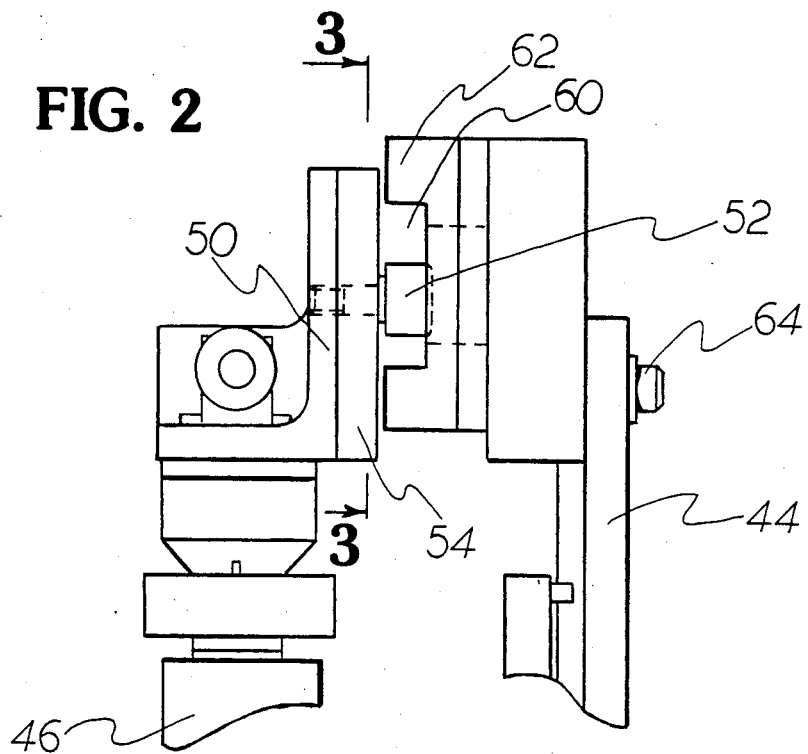
FIG. 2 is a side elevational view of the top portion of the insertion head illustrated in FIG. 1.
Figure 3:
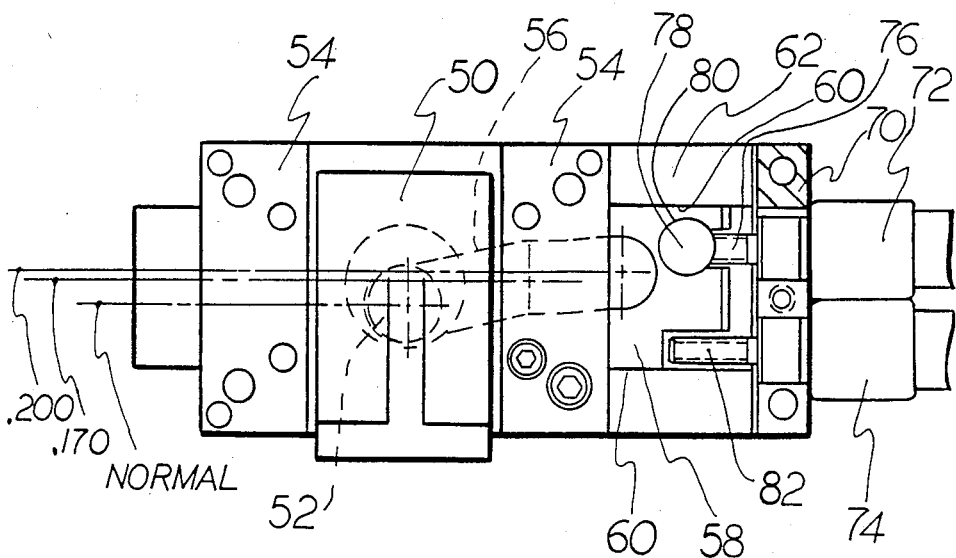
FIG. 3 is a view taken along line 3—3 of FIG. 2.

The upper end of the cylinder 46 is secured to an "L" shaped cam follower slide 50 (FIG. 2) which supports a cam roller 52. The slide 50 is supported between opposing follower guides 54 (FIG. 3) which support the slide for vertical displacement. The cam roller 52 is received by the cam slot 56 of a cam 58 which is received within a horizontally extending recess 60 defined in the cam guide 62. The cam guide is secured by screws 64 to the machine frame 44.

Secured to the cam guide 62 is a support bracket 70 for upper 72 and lower 74 cylinders. The rod 76 of the upper cylinder 72 is secured to the cam element 58 by securing the end of the rod to a connecting pin 78 located within a hole 80 in the cam element. The upper cylinder has a fixed stroke of 1½", and the cam slot is configured so that when the cam element is located at the end positions of the stroke of this cylinder, the cam roller will locate the gripper mechanism at the normal and 0.200 positions.

The rod 82 of the lower cylinder 74 is not connected to the cam element 58. When this cylinder is operated to advance the rod from right to left (a 1" stroke), the rod 82 engages and displaces the cam follower and displaces the cam slot to a selected position where the cam roller 52 locates the gripping mechanism at the 0.170 location. To subsequently locate the cam element 58 at either of the end positions, the upper cylinder 72 will be operated.

I claim:

1. A machine for inserting DIP components either into a circuit board or into sockets secured to the circuit board, the sockets having one of two heights, said inserting machine comprising:
    means for supporting a component at a gripping station,
    insertion head means for gripping a component supported at the gripping station including
        a housing
        a pair of opposed gripping jaws each supported on said housing for displacement from a retracted position to a gripping position,
    machine frame means,
    means for supporting said insertion head means for vertical displacement,
    cylinder means having a predetermined stroke for displacing said insertion head vertically downward a selected distance from an upper position, and
    means for defining said upper position at any one of three selected positions so that a component can be inserted into the circuit board or into sockets having either of said two heights including
        a cam,
        means for mounting said cam on said machine frame for displacement from a selected retracted position to two alternate advanced positions, cam follower means secured to said cylinder means for cooperating with said cam, said cam being configured so that the location of said cam at said retracted and two advanced positions will locate said cylinder means at said three selected positions, and means for displacing said cam between said retracted position and said two advanced positions.

2. A machine for inserting DIP components according to claim 1, wherein said cam displacing means comprises:

a first cylinder including a rod connected to said cam to displace said cam between said retracted position and one of said advanced positions, a second cylinder including a rod, and means for mounting said second cylinder so that operation of said second cylinder to advance said rod will result in said cam being pushed by said rod from said retracted position to the other of said advanced positions, and so that the retraction of said first cylinder rod will result in said cam pushing said second cylinder rod back to its retracted position.

* * * * *